United States Patent
Barat Quesada

(10) Patent No.: US 10,296,290 B2
(45) Date of Patent: May 21, 2019

(54) DIGITAL SIGNAL PROCESSOR

(71) Applicant: NXP B.V., Eindhoven (NL)

(72) Inventor: Francisco Barat Quesada, Leuven (BE)

(73) Assignee: NXP B.V., Eindhoven (NL)

( * ) Notice: Subject to any disclaimer, the term of this patent is extended or adjusted under 35 U.S.C. 154(b) by 89 days.

(21) Appl. No.: 14/964,817

(22) Filed: Dec. 10, 2015

(65) Prior Publication Data
US 2016/0188293 A1 Jun. 30, 2016

(30) Foreign Application Priority Data
Dec. 31, 2014 (EP) .................................... 14200747

(51) Int. Cl.
*G06F 5/01* (2006.01)
*G06F 7/483* (2006.01)
*H03M 7/24* (2006.01)

(52) U.S. Cl.
CPC .............. *G06F 5/012* (2013.01); *G06F 7/483* (2013.01); *H03M 7/24* (2013.01)

(58) Field of Classification Search
CPC ...................................................... G06F 7/483
See application file for complete search history.

(56) References Cited

U.S. PATENT DOCUMENTS

| | | |
|---|---|---|
| 4,872,132 A | 10/1989 | Retter |
| 5,751,902 A * | 5/1998 | Hofmann ................ G10L 19/06 704/219 |
| 9,423,999 B1 * | 8/2016 | Linzer .................... H04N 19/50 |
| 2009/0292750 A1 * | 11/2009 | Reyzin .................... G06F 7/483 708/209 |
| 2013/0262539 A1 | 10/2013 | Wegener |

FOREIGN PATENT DOCUMENTS

GB 2 323 189 A 9/1998

OTHER PUBLICATIONS

Extended European Search Report for Application No. 14200747.5 (dated Jun. 24, 2015).
Kobayashi, Shiro et al; "A New Approach for Block-Floating-Point Arithmetic"; 1999 IEEE International Conference on Acoustics, Speech and Signal Processing, Phoenix, AZ, USA, vol. 4; pp. 2009-2012 (Mar. 1999).
Tanaka, Hiroaki et al; "A Block-Floating-Point Processor for Rapid Application Development"; IEEE International Conference on Acoustics, Speech and Signal Processing, Honolulu, HI, USA; pp. II65-II68 (Apr. 2007).

* cited by examiner

*Primary Examiner* — Chuong D Ngo

(57) ABSTRACT

A processor configured to: receive, at a floating-point-input-terminal, an input-block of data comprising a plurality of floating-point numbers each floating-point number comprising a mantissa and an exponent; determine an input-scale-factor based on a previous-input-block-exponent-value associated with a previous-input-block of data; and convert the input-block of data into a fixed-point-block of data in accordance with the input-scale-factor, wherein the fixed-point-block of data comprises a plurality of fixed-point-values that can represent the plurality of floating-point numbers within a particular range.

16 Claims, 5 Drawing Sheets

DIGITAL SIGNAL PROCESSOR

CROSS-REFERENCE TO RELATED APPLICATIONS

This application claims the priority under 35 U.S.C. § 119 of European patent application no. 14200747.5, filed Dec. 31, 2014 the contents of which are incorporated by reference herein.

In digital signal processing data may be represented as a fixed point number or as a floating point number. A fixed point representation enables the use of highly efficient fixed point processors, which require low power and/or a small area of integrated circuit. However, fixed point numbers can only represent a low dynamic range of signal data. Conversely, floating point representation provides a greater dynamic range, that is, the ratio of the largest and smallest numbers that can be represented by a particular number of bits. However, the processing of floating point numbers typically requires more power and/or a greater area of integrated circuit, than required for fixed point numbers. Another option is to represent data in block floating point form which may enable high dynamic range data to be processed more efficiently than would be possible using floating point data.

According to a first aspect, there is provided a processor configured to:
receive, at a floating-point-input-terminal, an input-block of data comprising a plurality of floating-point numbers each floating-point number comprising a mantissa and an exponent;
determine an input-scale-factor based on a previous-input-block-exponent-value associated with a previous-input-block of data; and
convert the input-block of data into a fixed-point-block of data in accordance with the input-scale-factor, wherein the fixed-point-block of data comprises a plurality of fixed-point-values that can represent the plurality of floating-point numbers within a particular range.

Determining the input-scale-factor based on the previous-input-block-exponent-value enables the conversion to fixed-point data to be performed without having to separately read in the plurality of floating-point numbers in order to determine the value of the input-scale-factor that should be used. In this way, the processing can be performed more quickly and more efficiently.

The processor may be further configured to: set an out-of-range-indicator if the magnitude of one or more of the plurality of floating-point numbers is outside the particular range that can be represented by the fixed point number, for the input-scale-factor that was used; and if the out-of-range-indicator is set, then convert the input-block of data into a revised-fixed-point-block of data in accordance with a revised-input-scale-factor. In this way, the conversion to fixed-point data only needs to be re-performed if the initial conversion resulted in an unacceptable result.

The processor may be further configured to: detect and store a maximum-input-exponent-value of the plurality of floating-point numbers; and set the revised-input-scale-factor as the maximum-input-exponent-value.

The processor may be further configured to increment/increase or decrement/decrease the input-scale-factor in order to set the revised-input-scale-factor The processor may be further configured to:
detect and store a maximum-input-exponent-value of the plurality of floating-point numbers;
set an overflow-indicator if one or more of the plurality of floating-point numbers is above the particular range;
set an underflow-indicator if one or more of the plurality of floating-point numbers is below the particular range;
if the overflow-indicator and the underflow-indicator are not set, then set pre-processed-output-data as the fixed-point-block of data;
if the overflow-indicator or the underflow-indicator is set, then:
convert the input-block of data into a revised-block-fixed-point-block of data in accordance with the maximum-input-exponent-value; and
set pre-processed-output-data as the revised-block-fixed-point-block of data; and
provide the pre-processed-output-data to a block-fixed-point-output-terminal.

The processor may be configured to convert the plurality of floating-point numbers sequentially. The processor may be configured to detect the maximum-input-exponent-value during the conversion of the plurality of floating-point numbers.

The processor may be configured to set the underflow-indicator if:
one or more of the plurality of fixed-point-values is less than a predetermined threshold within the particular range; or
each of the plurality of fixed-point-values are below a predetermined threshold within the particular range.

The processor may be further configured to:
set a previous-input-block-underflow-indicator if one or more of a plurality of fixed-point-values relating to a previous-input-block of data is less than a predetermined threshold within a previous-input-block-range; and
determine the input-scale-factor in accordance with the previous-input-block-underflow-indicator.

The processor may be further configured to:
set a previous-input-block-overflow-indicator if one or more of a plurality of fixed-point-values relating to a previous-input-block of data is greater than a predetermined threshold within a previous-input-block-range; and
determine the input-scale-factor in accordance with the previous-input-block-overflow-indicator.

The conversion of the plurality of floating-point numbers may comprise:
an alignment step for each floating-point number in which each mantissa is stored in a load-register in accordance with a difference between each exponent and the input-scale factor; and
a rounding step in which each mantissa stored in the load register is rounded to provide the plurality of fixed-point-values.

The block-fixed-point-output-terminal may be configured to provide the pre-processed-output-data to a fixed-point-digital-signal-processor for processing in accordance with an algorithm to generate processed-block-fixed-point-output-data. The processor may be further configured to:
receive, at a block-fixed-point-input-terminal, the processed-block-fixed-point-output-data;
determine an output-scale-factor;
convert the processed-block-fixed-point-output-date into a plurality of processed-fixed-point numbers in accordance with the output-scale-factor,
provide, to an output-floating-point-data-terminal, output-floating-point-data based on the processed-fixed-point numbers.

The processor may be configured to determine the output-scale-factor in accordance with an amplification-factor based on the algorithm and:
   the input-scale-factor, if an overflow-indicator and an underflow-indicator are not set; or
   the maximum-input-exponent-value, if the overflow-indicator or the underflow-indicator is set.

The processor may be further configured to:
detect and store a maximum-output-exponent-value of the plurality of processed-fixed-point numbers; and
determine the input-scale-factor in accordance with a previous-maximum-output-exponent-value associated with a previous-input-block of data.

The processor may be further configured to perform an output-rounding-step comprising rounding the processed-fixed-point numbers in accordance with a difference between a number of bits of the fixed-point-values and a number of bits of a mantissa of the output-floating-point-data, wherein the output-floating-point-data is based on the rounded processed-fixed-point numbers.

There may be provided an apparatus comprising a plurality of processors disclosed herein, wherein each processor is configured to determine an input-scale-factor and an output-scale-factor for use by the respective processor.

According to a second aspect, there is provided, a method for controlling a processor, the method comprising:
   receiving an input-block of data comprising a plurality of floating-point numbers, each floating-point number comprising a mantissa and an exponent;
   determining an input-scale-factor based on a previous-input-block-exponent-value associated with a previous-input-block of data; and
   converting the input-block of data into a fixed-point-block of data in accordance with the input-scale-factor, wherein the fixed-point-block of data comprises a plurality of fixed-point-values that can represent the plurality of floating-point numbers within a particular range.

There may be provided a method for controlling a processor, the method comprising:
   receiving an input-block of data comprising a plurality of floating-point numbers each floating-point number having a mantissa and an exponent;
   determining an input-scale-factor based on a previous-input-block-exponent-value associated with a previous-input-block of data;
   converting the input-block of data into a block-fixed-point-block of data in accordance with the input-scale-factor, wherein the block-fixed-point-block of data comprises a plurality of fixed-point-values that can take values within a particular range;
   detecting and storing a maximum-input-exponent-value of the plurality of floating-point numbers;
   setting an overflow-indicator if one or more of the plurality of fixed-point-values is above the particular range;
   setting an underflow-indicator if one or more of the plurality of fixed-point-values is below the particular range;
   if the overflow-indicator and the underflow-indicator are not set, then setting pre-processed-output-data as the block-fixed-point-block of data; and
   if the overflow-indicator or the underflow-indicator is set, then:
      converting the input-block of data into a revised-block-fixed-point-block of data in accordance with the maximum-input-exponent-value; and
      setting pre-processed-output-data as the revised-block-fixed-point-block of data.

There may be provided an integrated circuit comprising any processor disclosed herein.

There may be provided a computer program, which when run on a computer, causes the computer to configure any apparatus, including a processor, circuit, controller, converter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

BRIEF DESCRIPTION OF DRAWINGS

Examples will now be described in detail with reference to the accompanying figures, in which.

DETAILED DESCRIPTION

A floating point number may comprise a sign bit, a mantissa, comprising a plurality of bits, and an exponent, comprising a second plurality of bits. A mantissa comprising a certain number of bits will provide for representation of numbers with a certain precision. The range of numbers that can be represented depends not only on the mantissa, but also on the number of bits in the exponent, with a greater number of bits in the exponent enabling representation of a greater range of numbers. The dynamic range of the representation is the ratio of the largest and smallest numbers that can be represented.

A fixed point number may comprise a plurality of bits. The magnitude of a particular fixed point number depends on the position of the radix point, the location of which is 'fixed' in relation to the plurality of bits. One of the bits of a fixed point number may be a sign bit, used to determine whether the number is positive or negative. Alternatively, a two's complement representation, that does not require a sign bit, may be used instead.

Processing floating point numbers is more computationally intensive than processing fixed point numbers with the same overall number of bits. Therefore, it may be advantageous to represent signal data using floating point numbers, because of their greater dynamic range, but to process the data using fixed point numbers. Converting a floating point algorithm to a fixed point algorithm may be quite inefficient. Advantageously, a block of floating point numbers may be converted into a block of fixed point numbers for processing, where the conversion uses the same exponent, or a 'common exponent', for each member of the block of floating point numbers. The common exponent will then be associated with all of the fixed point numbers in the converted block. The common exponent and the block of fixed point numbers may be referred to as a 'block floating point' number. The block of fixed point numbers may be processed efficiently by a fixed-point processor. By keeping a block of fixed-point numbers that share a common exponent (block floating point), the algorithm conversion from floating point to fixed point can be simplified. The processed block of fixed-point numbers, together with the common exponent, may then be converted back to floating point form for subsequent use. The use of a common exponent for an entire block of data may be advantageous if the dynamic range of the data within the block is not too great. This may arise in many signal processing applications where a signal has a high dynamic range, but varies relatively slowly over the portion of the signal contained in any particular block of data.

Figure 1:
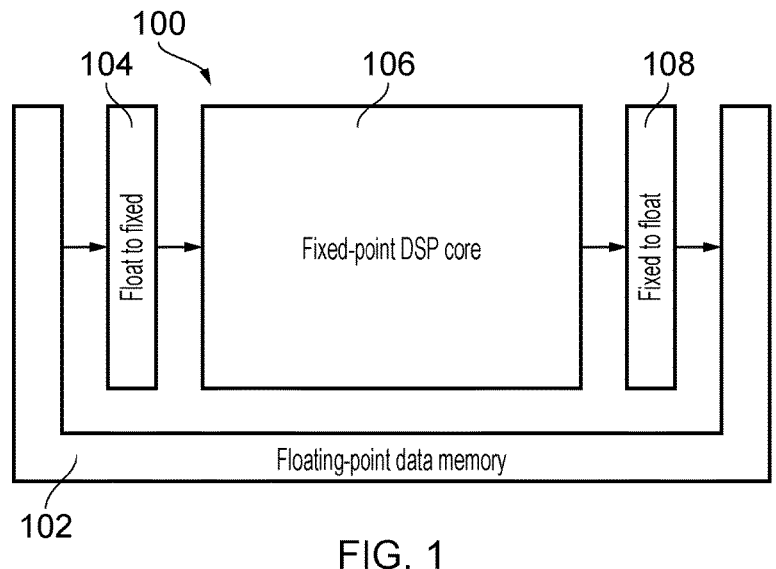
FIG. 1 shows a block diagram of a processor configured to process floating point data using a fixed point processor.

FIG. 1 shows a schematic diagram of a digital signal processor 100. The processor 100 comprises a floating-point data memory 102 configured to store data in floating point form. The floating-point data memory 102 is configured to supply a plurality of floating point numbers to a first converter 104 configured to convert the plurality of floating point numbers to a block of fixed point numbers, each with a common exponent. The first converter 104 is configured to supply the block of fixed point numbers to a fixed-point-processor 106 which is configured to process the block of fixed point numbers according to an algorithm to provide a block of processed fixed-point number to a second converter 108. The second converter 108 is configured to receive the block of processed fixed point numbers and convert them into a plurality of processed-floating-point numbers which may then be provided to the floating point data memory 102 for subsequent use.

A significant problem in converting floating point numbers to a block floating point representation is how to determine the value of the common exponent to use for the block floating point representation. Use of an inappropriate common exponent may result in the floating point numbers being either too large or too small to be represented by a particular block floating point representation. The common exponent may also be referred to as an input scale factor. A problem therefore is how to determine an appropriate input scale factor for the floating point to block floating point conversion process.

Figure 2:
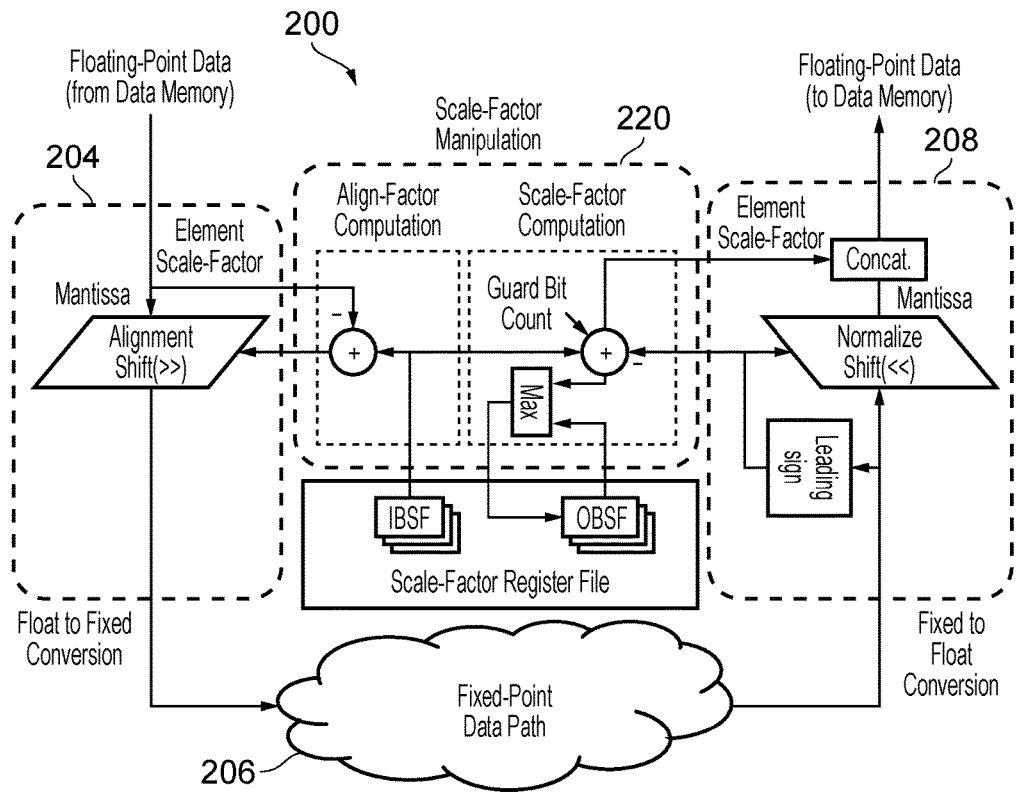
FIG. 2 shows a block diagram of a method for converting floating point data into block floating point data for processing and for converting processed block floating point data back to floating point form.

FIG. 2 shows a block diagram depicting a method for converting blocks of floating point data to block floating point form for processing, and then for converting processed block floating point data back to floating point form. A block of floating point numbers is supplied to a first converter 204 configured to convert the block of floating point numbers to a block of fixed point numbers. The first converter 204 is configured to perform the conversion using an input scale factor provided by a scale factor block 220. The first converter 204 is further configured to provide the block floating point number to a fixed point data path 206 for processing according to an appropriate algorithm to provide a processed block floating point number. The fixed point data path 206 is further configured to provide the processed block floating point number to a second converter 208. The second converter 208 is configured to convert the processed block of fixed point numbers into a block of processed floating point numbers according to an output scale factor provided by the scale factor block 220. The output scale factor may be determined in accordance with the input scale factor. Optionally, the determination of the output scale factor may use an amplification factor based on the algorithm used by the fixed point data path 220. For example, the output scale factor may be the sum of the input scale factor and the amplification factor. The second converter 208 may thus be configured to provide a block of processed floating point numbers to a floating point memory for subsequent use.

Figure 3:
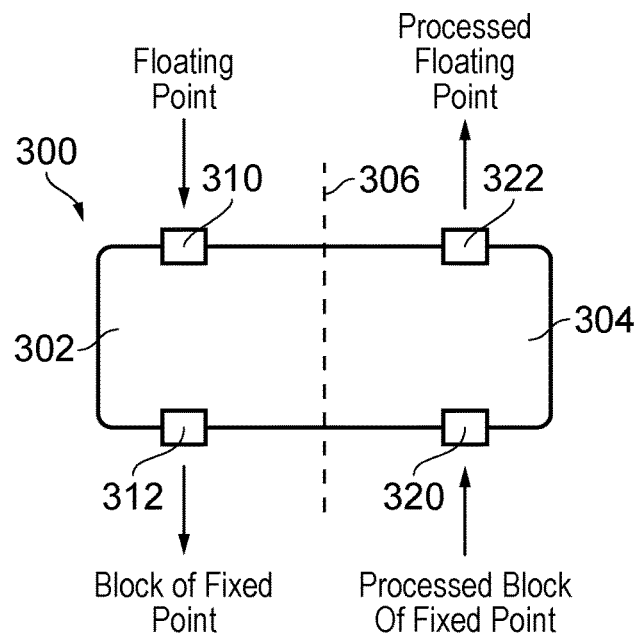
FIG. 3 shows a diagram of a processor configured to convert floating point data into fixed-point data for processing and to convert the processed fixed-point data back to floating point form.

FIG. 3 shows a schematic diagram of a processor 300 configured to convert a stream of floating point numbers into block of fixed point numbers and to convert a stream of block of fixed point numbers into floating point numbers. The processor 300 comprises a first portion 302 configured to convert floating point numbers into fixed point numbers and a second portion 304 configured to convert fixed point numbers into floating point numbers. The first portion 302 is depicted on the left hand side of a dotted line 306 while the second portion 304 is depicted on the right hand side of the dotted line 306. It will be appreciated that the two portions may be provided within a single processor or, in other examples, may comprise two separate processors.

The first portion 302 has a floating-point-input-terminal 310 configured to receive a plurality of floating-point numbers. The first portion 302 has a block-fixed-point-output-terminal 312 configured to provide the (pre-processed) block of fixed point numbers to an external fixed point memory or fixed point processor, such that the (pre-processed) block of fixed point numbers may be processed to provide a processed block of fixed point numbers.

The second portion 304 has a block-fixed-point-input-terminal 320 configured to receive a block of fixed point numbers, in this example the block of fixed point numbers from the block-floating-point-output-terminal 312 after they have been processed. The second portion 304 has an output-floating-point-data-terminal 322 configured to provide a block of (processed) floating point numbers to an external floating point memory or processor for subsequent use.

One possibility for determining an appropriate common exponent for converting a block of floating point numbers into a block of fixed point numbers is to read each floating point number in a particular block of floating point numbers and compare the value of each exponent to the exponent of the previous floating point number, keeping the larger exponent at each step, until all of the data has been read. This process will record the largest exponent in the block of floating point numbers, which may then be used as the common exponent for converting each floating point number in the particular block. This approach requires processing of the block of data two separate times; first to find the common exponent value based on the largest exponent, and second to convert the data from floating point form to block floating point form using the common exponent value.

Figure 4:
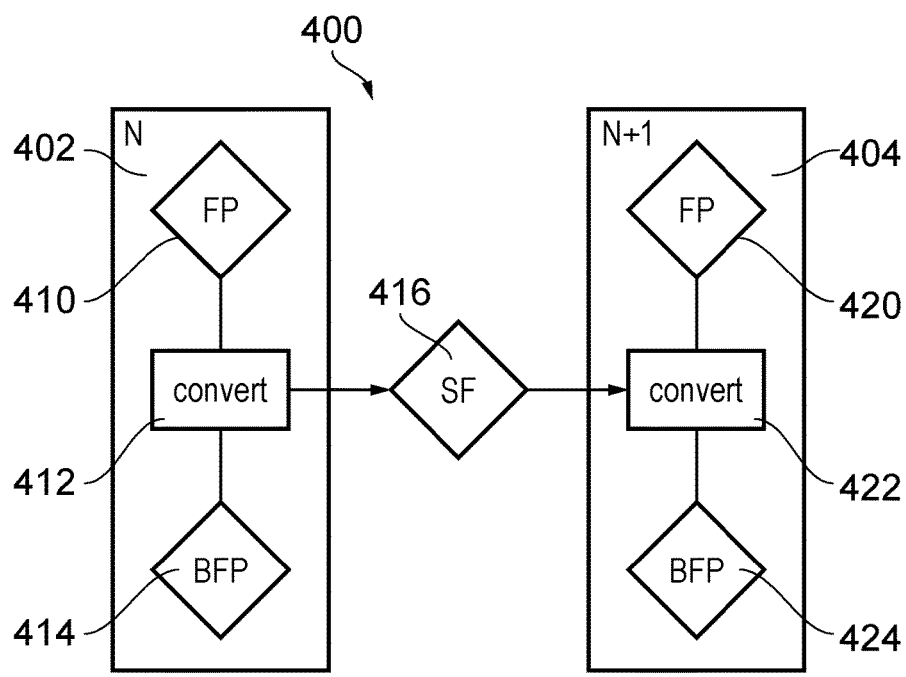
FIG. 4 shows a flow diagram illustrating a method for converting blocks of floating point data into fixed-point data.

FIG. 4 shows a block diagram depicting a method 400 for converting blocks of floating point numbers into block of fixed point numbers. The method 400 relates to a processor that may be configured to receive, at a floating-point-inputterminal, an input-block of data 410 comprising a plurality of floating-point numbers each floating-point number comprising a sign, mantissa and an exponent.

FIG. 4 shows a first block 402 of method steps in which the method processes an $N^{th}$ input-block of data 410. The method further comprises a conversion step 412 in which the processor determines an input-scale-factor 416 based on a previous-input-block-exponent-value associated with a previous-input-block of data. As will be discussed below, the previous-input-block-exponent-value may be based on an input-scaling-factor from the previous-input-block of data, or may be based on a maximum exponent value of the floating point numbers of the previous-input-block of data. If the $N^{th}$ input block of data 410 is actually the first input block of data, no previous-input-block of data may exist, in which case the input-scale-factor 416 may be read from a database or look-up table comprising values that are relevant to the particular signal processing task being undertaken.

The conversion step 412 further comprises converting the input-block of data 410 into a fixed-point-block of data 414 in accordance with the input-scale-factor 416, wherein the fixed-point-block of data 414 may comprise a plurality of fixed-point-values that can represent the plurality of floating-point numbers within a particular range. A particular block of fixed point numbers will only be able to represent numbers in a particular range, dependant on the number of bits that comprise each fixed point number and the number of bits that comprise the common exponent. Consequently, some floating point numbers may fall outside of the representable range, either by being larger than the largest number that can be represented or by being smaller than the least significant bit (smallest number) that can be represented by the particular block floating point number.

FIG. 4 also shows a second block 404 of method steps in which the method 400 processes an $(N+1)^{th}$ input-block of data 420. Again the processor may be configured to receive, at the floating-point-input-terminal, the second input-block of data 420 comprising a plurality of floating-point numbers each floating-point number comprising a sign, mantissa and an exponent. The method further comprises a conversion step 422 in which the processor determines an input-scale-factor based on the previous-input-block-exponent-value associated with a previous-input-block of data. In this case, a previous input block exists as it has been processed by the preceding first block 402 of the method 400. The input-scale-factor 416 used by the first block 402 is provided to the second block 404 in this example and is used to perform the conversion 422 of the floating point data 420 into a block floating point number 424 for the second block 404. By using the input-scale-factor 416 from the previous block of data, the method advantageously saves computational resources by avoiding the need to process the data twice, as described above. That is, the current block of floating point numbers 420 does not have to be separately processed in order to determine the input-scale-factor 416 that is to be used for the subsequent conversion to block floating point 424.

Figure 5:
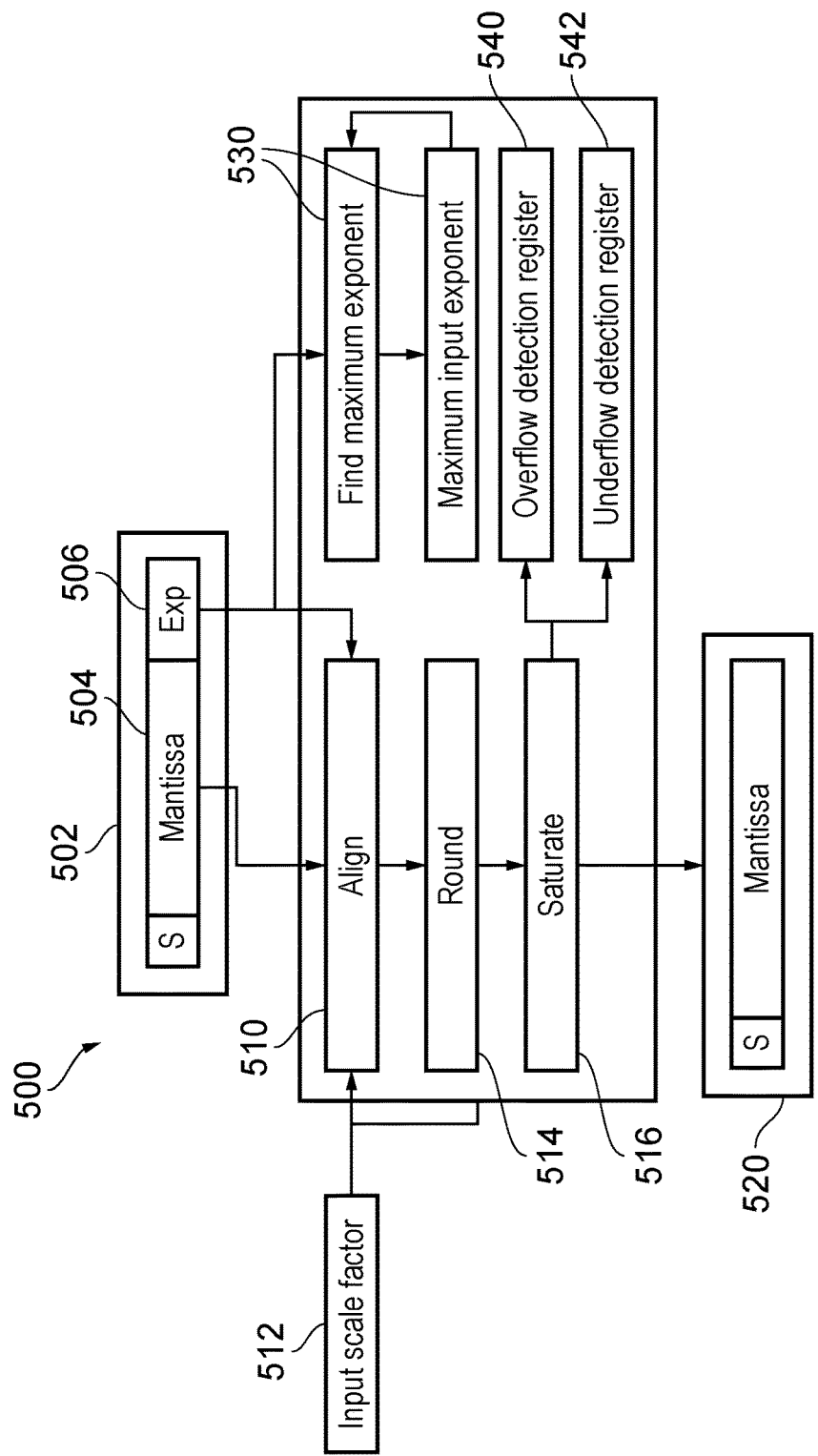
FIG. 5 shows a block diagram illustrating a method for converting a block of floating point data into a fixed-point number.

FIG. 5 shows a block diagram depicting a method 500 for converting a block of floating point numbers into a block of fixed point numbers. The method 500 relates to a processor that may be configured to read a floating point number 502, comprising a sign, a mantissa 504 and an exponent 506. The method comprises a conversion or alignment step 510 in which the mantissa 504 is stored in a memory register or load-register in a particular alignment which is based on an input-scale-factor 512. The alignment may be in accordance with a difference between the exponent 506 and the input-scale-factor 512. Thereby, the mantissa 504 may be converted to a fixed point number with an appropriate scale, based on the input-scale-factor 512.

The method 500 comprises an optional rounding step 514. In this example the fixed point number is truncated at the rounding step 514. In other examples, the rounding step 514 can be a proper rounding operation. There are several types of rounding that could be implemented, including round to zero, round to nearest, round to +infinity, and round to −infinity. The method 500 also comprises an optional saturation step 516 in which the fixed point number is processed to determine whether or not it is saturated. That is, if the magnitude of the fixed point number exceeds the maximum magnitude than can be represented by the particular block floating point number, then the number is set to the maximum representable value at the saturation step 516. The fixed point number 520 is then output as one of the plurality of fixed point numbers that comprise the block of fixed point numbers.

The method 500 comprises the step of detecting and storing 530 a maximum-input-exponent-value of the plurality of floating-point numbers 502. When reading a floating point number 502, the method 500 compares the exponent 506 value to any previously read exponent values for the same block of data to determine the greater of the two numbers, in the greater number is then stored in memory. Each subsequent exponent for the block of data that is read is similarly compared to the stored value, with the greater value being stored in the memory. When all of the plurality of floating point numbers in a particular block have been read, the largest exponent will be stored as the maximum-input-exponent value.

This mechanism can enable efficient computation of the input scale factor of a block of data and it can also allow fast recovery in combination with the overflow and overflow bits described below.

The method can include a step of setting an out-of-range-indicator if the magnitude of one or more of the plurality of floating-point numbers 502 is outside the particular range that can be represented by the fixed point number, for the input-scale-factor that was used. If the out-of-range-indicator is set, then the method can reprocess the fixed point numbers with a revised-input-scale-factor such that the out of range condition no longer exists. The revised-input-scale-factor may be a maximum-exponent-value associated with the block if this information is available, or it may be a modified version of the input scale factor that resulted in the out-of-range indicator being set. For example, the input scale factor may be modified by increasing or decreasing the input scale factor by a fixed amount. This modification step may be repeated as many times as is necessary in order to prevent the out-of-range-indicator being set. As described below, the out-of-range-indicator can be an overflow-indicator 540 or an underflow-indicator 542.

The method 500 comprises the step of setting an overflow-indicator 540 if one or more of the plurality of floating-point numbers 502 is above the particular range. That is, if a floating point number 502 is larger in magnitude than the fixed point number is capable of representing for the input-scale-factor that was used, then an overflow-indicator may be set. In some examples, the overflow-indicator may be set if the exponent for a particular floating point number 502 is greater than the input-scale-factor 512.

The overflow-indicator 540 can be considered as an optional sticky overflow bit for use to warn about saturation operations. That is, for an input block of data it can suffice that one data element overflows in the floating-point to fixed-point conversion to have this overflow bit set. The behaviour of the overflow bit can be implemented in software by comparing the input scale factor with the maximum-exponent-value. If the maximum-exponent-value is larger, there was overflow. It is convenient to have it in hardware to reduce the software overhead.

The method 500 comprises the step of setting an underflow-indicator 542 if one or more, or all, of the plurality of floating-point numbers is below the particular range. That is, if the magnitude of a particular floating point number 502 is smaller than can be represented by the fixed point number for the input-scale-factor that was used, then the underflow-indicator may be set. In some examples the underflow-indicator may be set if the floating point number 502, or all of the floating point numbers 502, is/are smaller than the least significant bit of the block floating point number.

The underflow-indicator 542 can be considered as an underflow bit that detects if all input data underflowed. This can be used to restart the computations with a better scaling factor. In some examples, the behaviour of this bit is sticky in the opposite way to the overflow bit in that all data elements must underflow to have this bit set to one at the end of the processing of one block of input data. Similarly to the overflow, the underflow can be implemented in software by comparing the input scale factor to the maximum-exponent-value. If the difference of the two is larger than the dynamic range of the fixed point number, then there was underflow. Again, use of an underflow bit can be convenient to reduce the software overhead.

The method 500 comprises a step of providing pre-processed-output-data to a block-fixed-point-output-terminal, wherein the pre-processed-output-data is in fixed point form. If the overflow-indicator and the underflow-indicator are not set, then the pre-processed-output-data comprises the block-fixed-point-block of data that was generated by using the input-scale-factor 512 associated with a previous block of data. Thereby, separate processing steps for determining and applying the scale factor are advantageously avoided.

If the overflow-indicator or the underflow-indicator is set, then the method converts the input-block of data into a revised-block-fixed-point-block of data in accordance with the maximum-input-exponent-value that was determined as part of the conversion to block floating point using the input-scale-factor 512 associated with a previous block of data. The maximum-input-exponent-value is an example of a revised-input-scale-factor. This step of performing the second conversion may be performed after all of the floating point numbers 502 of the block of data have been processed so that the maximum-input-exponent-value relates to the entire block of data. The method then sets the pre-processed-output-data as the revised-block-fixed-point-block of data. By using the maximum-input-exponent-value instead of the input-scale-factor associated with the previous-input-block of data, the method avoids providing an output that is scaled to be either too large or too small to be properly represented by the chosen block floating point representation. This second conversion step, of computing the revised-block-fixed-point-block of data is only performed when the method 500 detects that it is necessary because the original scale factor was either to larger or too small. If the data being processed varies relatively slowly, compared to the size of each block of data, the need to perform the second step may advantageously be avoided for a majority of blocks of data processed, thereby speeding up the processing and rendering it more efficient.

The processor described above may be configured to convert the plurality of floating-point numbers sequentially/serially.

A processor according to the present disclosure may be configured to detect the maximum-input-exponent-value during the conversion of the plurality of floating-point numbers. That is, the process of detecting the maximum-input-exponent-value may be performed while the plurality of floating-point numbers are being converted to fixed-point form. As shown in FIG. 5, (i) the alignment step 510 and (ii) the detecting and storing a maximum-input-exponent-value step 530, may be performed simultaneously, as part of the same memory read/access, for the floating-point numbers 502 as they are processed sequentially.

In some examples the underflow-indicator may be set if one or more of the plurality of fixed-point-values is less than a predetermined threshold within the particular range. The predetermined threshold may advantageously be set at a value close to the least significant bit but larger than the least significant bit.

In some examples the underflow-indicator may be set if each of the plurality of fixed-point-values are below a predetermined threshold within the particular range. In such cases it may be advantageous to recalculate the block floating point number since if all of the fixed-point values are below some threshold, the range of the block floating point number is not being fully utilised and the floating point numbers could be better represented, with greater precision, if a larger scale factor is used in the conversion from floating point to fixed point.

A processor according to the present disclosure may be configured to set a previous-input-block-underflow-indicator if one or more of a plurality of fixed-point-values relating to a previous-input-block of data is less than a predetermined threshold within a previous-input-block-range. The input-scale-factor may then be determined in accordance with the previous-input-block-underflow-indicator. That is, if the previous-input-block-underflow-indicator is set, then the input-scale-factor can be set as the maximum-exponent-value for the previous block, instead of as the input-scale-factor for the previous block. In some examples it may be considered inefficient to re-compute a block floating point number with a different scale factor if one or more, or all, of the block of fixed point numbers are below a certain threshold value, but are still within the range that may be represented by the block floating point number. However, if one or more of the fixed point numbers have values below the threshold then this may indicate that the scale factor used for the current block of data will likely be too small for the next block of data. By setting a previous-input-block-underflow-indicator, the processor may be configured to adjust the input-scale-factor to a more appropriate value for the next block of data to be processed.

A processor according to the present disclosure may be configured to set previous-input-block-overflow-indicator if one or more of a plurality of fixed-point-values relating to a previous-input-block of data is greater than a predetermined threshold within a previous-input-block-range. The input-scale-factor may then be determined in accordance with the previous-input-block-overflow-indicator, in a similar way to that described above with reference to the previous-input-block-overflow-indicator. In some examples it may be considered inefficient to re-compute a block floating point number with a different input-scale-factor if one or more, or all, of the block of fixed point numbers are above a certain threshold value, but are still within the range that may be represented by the block floating point number. However, if one or more of the fixed point numbers have values above the threshold then this may indicate that the scale factor used for the current block of data will likely be too large for the next block of data. By setting a previous-input-block-overflow-indicator, the processor may be configured to adjust the input-scale-factor to a more appropriate value for the next block of data to be processed.

In some examples, registers in the load/store units can be replicated to enable simultaneous access to blocks of data with different scaling factors.

Figure 6:
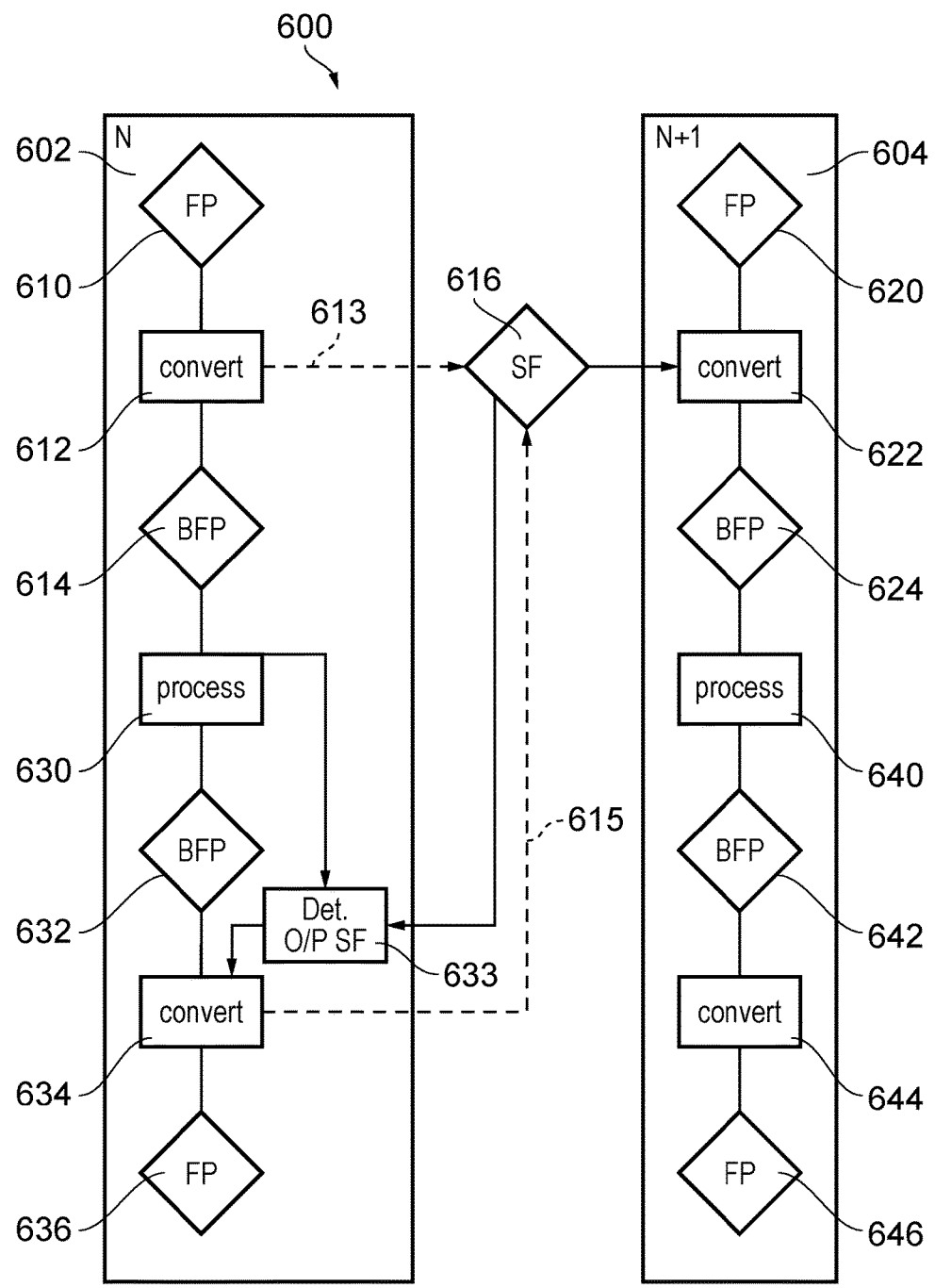
FIG. 6 shows a flow diagram illustrating a method for converting a block of floating point data into fixed-point data for processing and then converting processed fixed-point data back into floating point data.

FIG. 6 shows a block diagram depicting a method 600 for converting blocks of floating point numbers into blocks of fixed point numbers for processing and then converting processed blocks of fixed point numbers into blocks of floating point numbers. The method 600 comprises some parts that are similar to the parts of the method disclosed above in relation to FIG. 4, and similar parts of the method have been given similar reference numerals and will not necessarily be discussed further.

The method 600 relates to a processor that may be configured to provide, at a block-floating-point-output-terminal, pre-processed-output-data 614, 624 in the form of a fixed point number. The pre-processed-output-data 614, 624 may be provided to a fixed-point-digital-signal-processor for processing 630, 640 in accordance with an algorithm to generate processed-block-floating-point-output-data 632, 642. Any algorithm may be used, such as algorithms for applying a Fast Fourier Transform (FFT) or a Finite Impulse Response (FIR) filter.

The method 600 relates to a processor that may be further configured to receive, at a block-fixed-point-input-terminal, the processed-block-fixed-point-output-data 632, 642. The method 600 may determine an output scale factor 633 and convert 634, 644 the processed-block-floating-point-output-data 632, 642 into a plurality of processed-floating-point numbers 636, 646 in accordance with the output-scale-factor. Output-floating-point-data based on the processed-floating-point numbers may be provided to an output-floating-point-data-terminal that may be configured to provide the output-floating-point-data to a floating point data memory or processor for subsequent use.

The output-scale-factor is determined in accordance with an amplification-factor based on the algorithm performed at the processing step 630, 640. The output-scale-factor is also determined in accordance with the scale factor used at the conversion step 612, 622 to convert the input-block of data 610, 620 into fixed point form 614, 624. It will be appreciated that, if the overflow-indicator and the underflow-indicator were not set, then the relevant scale factor will relate to the previous-input-block-exponent-value. However, if the overflow-indicator or the underflow-indicator was set then the relevant scale factor will relate to the maximum-input-exponent-value. The output-scale-factor may be the sum of the amplification factor and the input-scale-factor or maximum-input-exponent-value as appropriate. In some examples the algorithm may not amplify the signal, in which case the amplification factor would be one (and the exponent value to be added would be zero).

FIG. 6 shows a first block 602 of method steps in which the method 600 is performed for an $N^{th}$ input-block of data 610, which may be a first input-block. FIG. 6 also shows a second block 604 of method steps in which the method 600 is performed for an $(N+1)^{th}$ input-block of data 620, which may be a second or subsequent block of data processed after the $N^{th}$ block 610.

In some examples a processor may be configured to detect and store a maximum-output-exponent-value of the plurality of processed-fixed-point numbers as discussed above. The input-scale-factor used for the conversion to block floating point 612 may be determined in accordance with a previous-maximum-output-exponent-value associated with a previous-input-block of data. Thereby, the maximum-output-exponent-value determined in the first block 602 may be used to determine the scale factor 616 used in the conversion step 622 in the second block 604, as shown with dotted line 615 in FIG. 6. Use of an output scale factor to determine the scale factor for converting the next input-block of data may be particularly advantageous where the processing step 630, 640 involves the calculation of a FFT because the FFT operation can scale the values in such a way as to reduce the likelihood of overflow.

It will be appreciated that the scale factor 616 may be based on values determined at either the first conversion step 612 (as shown with dotted line 613) or the second conversion step 634 (as shown with dotted line 615) or both. It will be further appreciated that the scale factor may depend on values determined in processing the block of input-data that immediately precedes the block being processed or may depend on values determined while processing a plurality of preceding blocks of input data.

Figure 7:
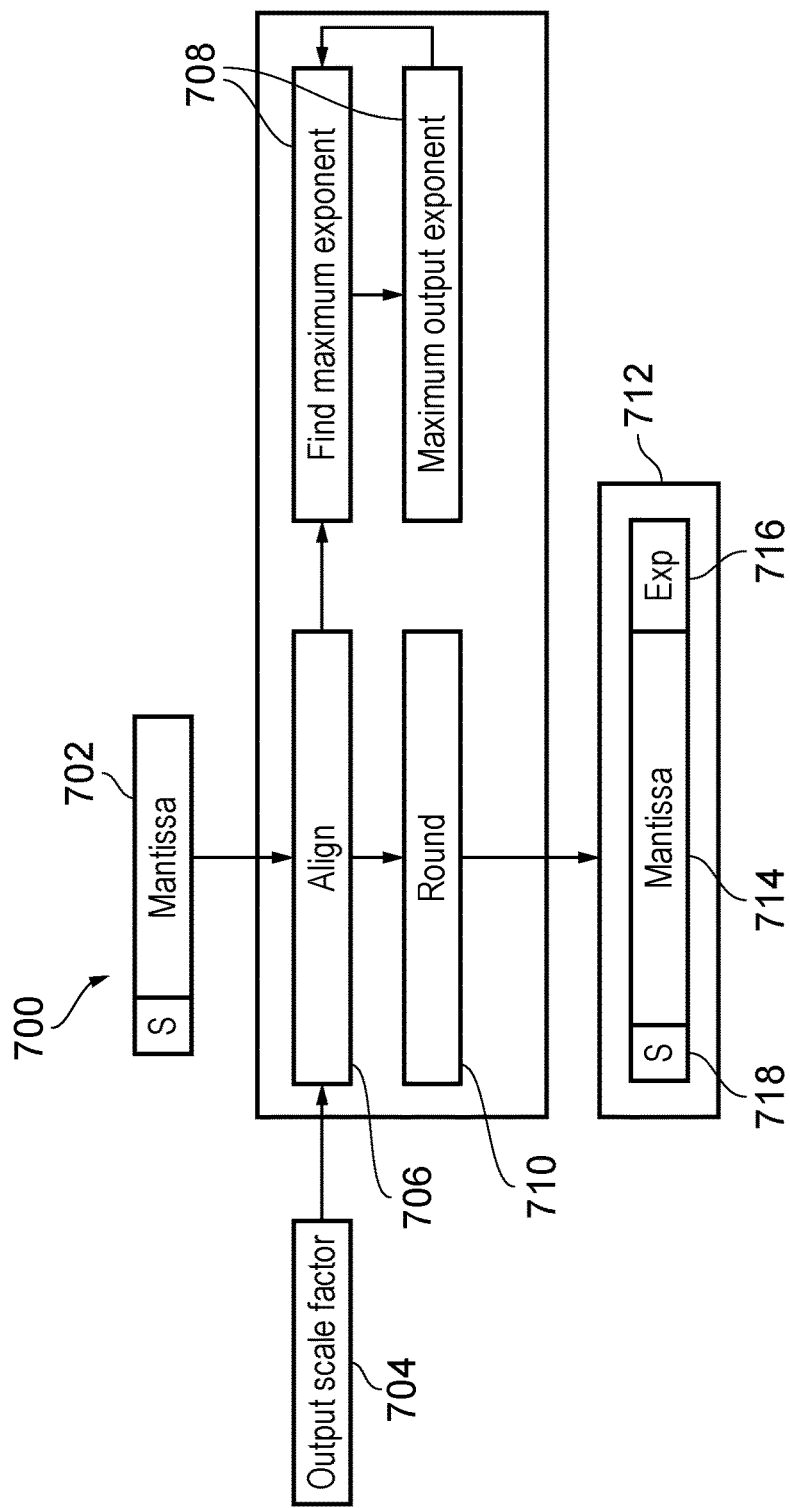
FIG. 7 shows a block diagram illustrating a method for converting fixed-point data to floating point data.

FIG. 7 illustrates a method 700 for converting a (processed) block of fixed point numbers into (processed) floating point numbers. A fixed point number 702, which is part of the (processed) block of fixed point numbers, is read and stored in a store register in an alignment step 706, where the alignment of the fixed point number is based on an output-scale factor 704. A store exponent is provided, based on the output-scale factor 704, to convert the fixed point number 702 into a processed floating point number. The method may also compare the exponent of the processed floating point number to the exponents of previously converted numbers from the same block to determine a maximum exponent value in a maximum exponent value determining step 708.

The method 700 further comprises an optional output-rounding-step 710 comprising rounding the processed-floating-point number in accordance with a difference between a number of bits of the fixed-point-values and a number of bits of a mantissa 714 of the output-floating-point-data 712. The output-floating-point-data 712 may then be based on the rounded processed-fixed-point numbers where the fixed point number has a greater number of bits than the mantissa 714 of the processed-floating point number 712. Output-floating-point-data 712 comprises a mantissa 714, an exponent 716 and, as shown here, an optional sign bit 718.

In some examples, an apparatus may comprise a plurality of the processors disclosed above, wherein each processor may be configured to determine a scale-factor and an output-scale-factor for use by the respective processor. Thereby, different data streams may be processed in parallel. For example, a process involving an FIR filter may use one processor to process the signal input and a different processor to process the filter coefficients.

It will be appreciated that the processors and/or apparatus disclosed above may be embodied in an integrated circuit.

Embodiments of the present disclosure may be advantageously used in conjunction with computer code written in C. The compiler may use the functions to_fix and to_float to configure the load exponent and the store exponent. The functions will be associated by the compiler with one of the processor's address generation unit's as inferred from the data types. By making the load exponent and the store exponent visible a C level, the programmer and compiler have full flexibility in controlling the exponent of a block of data. The compiler can decide to allocate a value for a complete block if the code is written as such. An example of suitable C code is provided below:

```
1  bfp x[N];
2  bfp y[N];
3  bfp z[N];
4  fix c[N];
5
6  int exp_x = 0;
7  // Calculate input exponent
8  for (int n = 0; n < N; n++) {
9      to_fix(x[n] , 0, exp_x);
10 }
11 // exp_x contains the largest exponent from x
12
13 // Compute x*c
14 int exp_y = exp_x -1; // We assume the computation reduces exponent by 1
15 int max_exp_y = -128;
16 for (int n = 0; n < N; n++) {
17     fix m = to_fix(x[n] , exp_x) * c[n];
18     y[n] = to_bfp(m, exp_y, mas_exp_y);
19 }
20
21 // Compute y*2
22 int exp_z = exp_y + 1; // We assume the computation reduces exponent by 1
23 int max_exp_z = -128;
24 for (int n = 0; n < N; n++) {
25     fix m = to_fix(y[n] , max_exp_y);
26     z[n] = to_bfp(m, exp_z, mas_exp_z);
```

In one example implementation, fixed-point numbers have 32 bits and the floating-point numbers have a mantissa comprising 24 bits, including the sign. The DSP converts the floating-point to fixed-point during memory transfers. This can mean that if the load/store exponents are correctly set, the maximum dynamic range which does not introduce error in the floating-point to fixed-point conversion is 8 bits. In other words: if the smallest value in a block is at most 256 times smaller than the largest value in the block, then there will be no error introduced in the conversion. If this is not the case, then some LSBs will be lost in the smaller values. Conversely, if the output exponent is set correctly, the maximum dynamic range difference when writing to memory will be 8 bits.

In an alternative example implementation, a 24-bit DSP can be used to process a floating-point format with 18 bits mantissa, plus sign, and an exponent with 6 bits. A SNR study can be performed to evaluate the best split between mantissa/exponent.

NUMERICAL EXAMPLES

Example Format

This section presents some numerical examples using a floating-point format with 1-bit sign, 4-bit mantissa and 3-bit exponent in two's complement. As in the standard IEEE754.1, the mantissa's most leading one is omitted from the binary representation. The exponent ranges from −4 to 3. A number X is thus represented as:

$$X = S * 1 \cdot M * 2^E$$

The sign S takes the values +1 (0 in binary) and −1 (1 in binary). The exponent takes the value from −4 to 3 (100 to 011 in two's complement binary). The mantissa ranges from 1.0000 to 1.1111 in binary. We will not focus on how to represent exceptions (such as zero and infinity).

The following table shows some example numbers and their representation in floating point using the format outlined above.

| Real number | Mantissa | Exponent (binary) | Mantissa in binary including leading one | Floating point in binary |
|---|---|---|---|---|
| 0.5    | 1.0 | −1 (111) | 1.0000 | 0 111 0000 |
| 0.25   | 1.0 | −2 (110) | 1.0000 | 0 110 0000 |
| 0.75   | 1.5 | −1 (110) | 1.1000 | 0 111 1000 |
| −3     | 1.5 | 1 (001)  | 1.1000 | 1 001 1000 |
| −7.875 |     | 2 (010)  | 1.1111 | 1 010 1111 |

The computations will be performed in fixed point with 8 bits:

| Real number | |
|---|---|
| 0.5       | 0.100 0000 |
| 0.9921875 | 0.111 1111 |
| −0.5      | 1.100 0000 |
| 0.25      | 0.010 0000 |

How to Calculate $$S = \text{sign}(X)$$

$$E = \text{int}(\log 2(|X|))$$

$$M = |X| * 2^{\wedge}(-E)$$

Input Block

Let's assume the following block of input data:

$$X(n) = \{0.5, -0.25, 0.25, -0.5\}$$

And the following computation:

$$Y(n) = (X(n) + X(n-1))/2$$

Assuming $X(-1) = 0$

This computation can be done by adding the two numbers ($X(n)$ and $X(n-1)$) and then multiplying by 0.5. The multiplication can be subsumed in the output scaling factor by subtracting one from the input scaling factor.

Example with Input Scaling Factor of 0

If the input scaling factor (ISF) is 0, then the output scaling factor (OSF) equals ISF-1, which is −1.

| X(n) | Float | Fixed X(n) | Fixed X(n)−X(n − 1) | Float without OSF | Float with OSF |
|---|---|---|---|---|---|
| 0.5   | 1.0 * 2^−1  | 0.100 0000 | 0.100 0000 | 1.0 * 2^−1  | 1.0 * 2^−2  |
| −0.25 | −1.0 * 2^−2 | 1.110 0000 | 0.010 0000 | 1.0 * 2^−2  | 1.0 * 2^−3  |
| −0.5  | −1.0 * 2^−1 | 1.100 0000 | 1.010 0000 | −1.5 * 2^−1 | −1.5 * 2^−2 |
| 0.25  | 1.0 * 2^−2  | 0.010 0000 | 1.110 0000 | −1.0 * 2^−2 | −1.0 * 2^−3 |

In this case, there was no overflow or underflow.

The maximum Input exponent was −1 and since they were all under the ISF, there is no overflow. Since none of the input values underflowed, there is also no global underflow.

Example with Input Scaling Factor of 2

If the input scaling factor (ISF) is 2, then the output scaling factor equals ISF-1, which is 1.

| X(n) | Float | Fixed X(n) | Fixed X(n)-X(n − 1) | Float without OSF | Float with OSF |
|---|---|---|---|---|---|
| 0.5   | $1.0 * 2^{-1}$  | 0.001 0000 | 0.001 0000 | $1.0 * 2^{-3}$  | $1.0 * 2^{-2}$  |
| −0.25 | $−1.0 * 2^{-2}$ | 1.111 1000 | 0.000 1000 | $1.0 * 2^{-4}$  | $1.0 * 2^{-3}$  |
| −0.5  | $−1.0 * 2^{-1}$ | 1.111 0000 | 1.110 1000 | $−1.5 * 2^{-3}$ | $−1.5 * 2^{-2}$ |
| 0.25  | $1.0 * 2^{-2}$  | 0.000 1000 | 1.111 1000 | $−1.0 * 2^{-4}$ | $−1.0 * 2^{-3}$ |

In this case, there was no overflow or underflow.

The maximum input exponent was −1 and since they were all under the ISF, there is no overflow. Since none of the input values underflowed, there is also no global underflow. Note that the results are identical to the previous example since no bits were lost.

Example with Input Scaling Factor of −1

If the input scaling factor (ISF) is −1, then the output scaling factor is ISF-1, which is −2.

| X(n) | Float | Fixed X(n) | Fixed X(n)-X(n − 1) | Float without OSF | Float with OSF |
|---|---|---|---|---|---|
| 0.5   | $1.0 * 2^{-1}$  | 0.111 1111 | 0.111 1111 | $1.984375 * 2^{-2}$ | $1.984375 * 2^{-3}$ |
| −0.25 | $−1.0 * 2^{-2}$ | 1.100 0000 | 0.011 1111 | $1.96875 * 2^{-3}$  | $1.96875 * 2^{-4}$  |
| −0.5  | $−1.0 * 2^{-1}$ | 1.000 0000 | 1.000 0000 | $−1.0 * 2^{-0}$     | $−1.0 * 2^{-1}$     |
| 0.25  | $1.0 * 2^{-2}$  | 0.100 0000 | 1.100 0000 | $−1.0 * 2^{-2}$     | $−1.0 * 2^{-3}$     |

In this case, there was overflow on 0.5, which saturated to 0.49609375, and no underflow. The results are not identical to the previous example since some bits were lost due to saturation. In this case, the application might decide to repeat the computations with an ISF of 0, based on the maximum input exponent of −1.

Examples disclosed herein relate to an extension to a fixed-point DSP to enable efficient processing of floating-point data by converting floating-point data to fixed-point as a side-effect of memory accesses. The conversion can be controlled via programmable exponent configuration registers. The hardware described can allows efficient computation of block floating point, though the numbers in memory are stored as floating-point. The proposed architecture can also be easily targeted by a compiler, for example using C API extensions.

Examples described above can provide a solution where block floating point can be achieved with minimal bookkeeping and with reduced performance loss due to the scaling operations. This can be especially desirable in power constrained systems. Computation with floating-point data, with low area and power overhead, can be achieved, when compared to a pure floating point implementation in hardware.

The invention claimed is:

1. A processor comprising:
a floating-point-input-terminal configured to receive an input-block of data comprising a plurality of floating-point numbers, each floating-point number comprising a mantissa and an exponent; and
a processing element configured to:
use an input-scale-factor of a previous-input-block of data as an input-scale-factor of the input-block of data;
convert the input-block of data into a fixed-point-block of data in accordance with the input-scale-factor,
wherein the fixed-point-block of data comprises a plurality of fixed-point-values that can represent the plurality of floating-point numbers within a particular range;
determine that the magnitude of one or more of the plurality of floating-point numbers is outside the particular range and set an out-of-range-indicator; and
determine that the out-of-range-indicator is set and convert the input-block of data into a revised-fixed-point-block of data in accordance with a revised-input-scale-factor;
wherein the processing element is further configured to:
detect and store a maximum-input-exponent-value of the plurality of floating-point numbers;
set an overflow-indicator if one or more of the plurality of floating-point numbers is above the particular range;
set an underflow-indicator if one or more of the plurality of floating-point numbers is below the particular range;
if the overflow-indicator and the underflow-indicator are not set, then set pre-processed-output-data as the fixed-point-block of data;
if the overflow-indicator or the underflow-indicator is set, then:
convert the input-block of data into a revised-block-fixed-point-block of data using the maximum-input-exponent-value as a revised input-scale-factor; and
set pre-processed-output-data as the revised-block-fixed-point-block of data; and
provide the pre-processed-output-data to a block-fixed-point-output-terminal.

2. The processor of claim 1, wherein the processing element is further configured to:
detect and store a maximum-input-exponent-value of the plurality of floating-point numbers; and
set the revised-input-scale-factor as the maximum-input-exponent-value.

3. The processor of claim 1, wherein the processing element is configured to convert the plurality of floating-point numbers sequentially.

4. The processor of claim 1, wherein the processing element is configured to detect the maximum-input-exponent-value during the conversion of the plurality of floating-point numbers.

5. The processor of claim 1, wherein the processing element is configured to set the underflow-indicator if:
one or more of the plurality of fixed-point-values is less than a predetermined threshold within the particular range; or
each of the plurality of fixed-point-values are below a predetermined threshold within the particular range.

6. The processor of claim 1, wherein the processing element is further configured to:
set a previous-input-block-underflow-indicator if one or more of a plurality of fixed-point-values relating to a previous-input-block of data is less than a predetermined threshold within a previous-input-block-range; and
determine the input-scale-factor in accordance with the previous-input-block-underflow-indicator.

7. The processor of claim 1, wherein the processing element is further configured to:
set a previous-input-block-overflow-indicator if one or more of a plurality of fixed-point-values relating to a previous-input-block of data is greater than a predetermined threshold within a previous-input-block-range; and
determine the input-scale-factor in accordance with the previous-input-block-overflow-indicator.

8. The processor of claim 1, wherein the conversion of the plurality of floating-point numbers comprises:
an alignment step for each floating-point number in which each mantissa is stored in a load-register in accordance with a difference between each exponent and the input-scale factor; and
a rounding step in which each mantissa stored in the load register is rounded to provide the plurality of fixed-point-values.

9. The processor of claim 1, wherein the block-fixed-point-output-terminal is configured to provide the pre-processed-output-data to a fixed-point-digital-signal-processor for processing in accordance with an algorithm to generate processed-block-fixed-point-output-data, and wherein the processor is further configured to:
receive, at a block-fixed-point-input-terminal, the processed-block-fixed-point-output-data;
determine an output-scale-factor;
convert the processed-block-fixed-point-output-data into a plurality of processed-fixed-point numbers in accordance with the output-scale-factor;
provide, to an output-floating-point-data-terminal, output-floating-point-data based on the processed-fixed-point numbers.

10. The processor of claim 9, wherein the processing element is configured to determine the output-scale-factor in accordance with an amplification-factor based on the algorithm and:
the input-scale-factor, if an overflow-indicator and an underflow-indicator are not set; or
the maximum-input-exponent-value, if the overflow-indicator or the underflow-indicator is set.

11. The processor of claim 9, wherein the processing element is further configured to:
detect and store a maximum-output-exponent-value of the plurality of processed-fixed-point numbers; and
determine the input-scale-factor in accordance with a previous-maximum-output-exponent-value associated with a previous-input-block of data.

12. An apparatus comprising a plurality of the processors of claim 9, wherein each processor is configured to determine an input-scale-factor and an output-scale-factor for use by the respective processor.

13. A method for controlling a processor, the method comprising:
receiving an input-block of data comprising a plurality of floating-point numbers, each floating-point number comprising a mantissa and an exponent;
using an input-scale-factor of a previous-input-block of data as an input-scale-factor of the input-block of data;
converting the input-block of data into a fixed-point-block of data in accordance with the input-scale-factor, wherein the fixed-point-block of data comprises a plurality of fixed-point-values that can represent the plurality of floating-point numbers within a particular range;
determining that the magnitude of one or more of the plurality of floating-point numbers is outside the particular range and setting an out-of-range-indicator; and
determining that the out-of-range-indicator is set and converting the input-block of data into a revised-fixed-point-block of data in accordance with a revised-input-scale-factor;
the method further comprising:
detecting and storing a maximum-input-exponent-value of the plurality of floating-point numbers;
setting an overflow-indicator if one or more of the plurality of floating-point numbers is above the particular range;
setting an underflow-indicator if one or more of the plurality of floating-point numbers is below the particular range;
if the overflow-indicator and the underflow-indicator are not set, then setting pre-processed-output-data as the fixed-point-block of data;
if the overflow-indicator or the underflow-indicator is set, then:
converting the input-block of data into a revised-block-fixed-point-block of data using the maximum-input-exponent-value as a revised input-scale-factor; and
setting pre-processed-output-data as the revised-block-fixed-point-block of data; and
providing the pre-processed-output-data to a block-fixed-point-output-terminal.

14. A processor comprising:
a floating-point-input-terminal configured to receive an input-block of data comprising a plurality of floating-point numbers, each floating-point number comprising a mantissa and an exponent; and
a processing element configured to:
use an input-scale-factor of a previous-input-block of data as an input-scale-factor of the input-block of data;
convert the input-block of data into a fixed-point-block of data in accordance with the input-scale-factor, wherein the fixed-point-block of data comprises a plurality of fixed-point-values that can represent the plurality of floating-point numbers within a particular range;

determine that the magnitude of one or more of the plurality of floating-point numbers is outside the particular range and set an out-of-range-indicator; and determine that the out-of-range-indicator is set and convert the input-block of data into a revised-fixed-point-block of data in accordance with a revised-input-scale-factor;

wherein the processing element is configured to convert the plurality of floating-point numbers sequentially; and wherein the processing element is configured to detect the maximum-input-exponent-value during the conversion of the plurality of floating-point numbers.

15. The processor of claim 14, wherein the processing element is further configured to:

detect and store a maximum-input-exponent-value of the plurality of floating-point numbers; and set the revised-input-scale-factor as the maximum-input-exponent-value.

16. The processor of claim 14, wherein the processing element is further configured to:

detect and store a maximum-input-exponent-value of the plurality of floating-point numbers;

set an overflow-indicator if one or more of the plurality of floating-point numbers is above the particular range;

set an underflow-indicator if one or more of the plurality of floating-point numbers is below the particular range;

if the overflow-indicator and the underflow-indicator are not set, then set pre-processed-output-data as the fixed-point-block of data;

if the overflow-indicator or the underflow-indicator is set, then:

convert the input-block of data into a revised-block-fixed-point-block of data in accordance with the maximum-input-exponent-value; and set pre-processed-output-data as the revised-block-fixed-point-block of data; and provide the pre-processed-output-data to a block-fixed-point-output-terminal.

\* \* \* \* \*